(12) United States Patent
Shen et al.

(10) Patent No.: US 11,158,608 B2
(45) Date of Patent: Oct. 26, 2021

(54) SEMICONDUCTOR PACKAGE INCLUDING OFFSET STACK OF SEMICONDUCTOR DIES BETWEEN FIRST AND SECOND REDISTRIBUTION STRUCTURES, AND MANUFACTURING METHOD THEREFOR

(71) Applicant: Powertech Technology Inc., Hsinchu County (TW)

(72) Inventors: Kuang-Jen Shen, Hsinchu County (TW); Chen-Pei Hsieh, Hsinchu County (TW)

(73) Assignee: Powertech Technology Inc., Hsinchu County (TW)

( * ) Notice: Subject to any disclaimer, the term of this patent is extended or adjusted under 35 U.S.C. 154(b) by 195 days.

(21) Appl. No.: 16/581,773

(22) Filed: Sep. 25, 2019

(65) Prior Publication Data

US 2021/0091043 A1 Mar. 25, 2021

(51) Int. Cl.
  *H01L 25/065* (2006.01)
  *H01L 23/00* (2006.01)
  (Continued)

(52) U.S. Cl.
  CPC ........ *H01L 25/0657* (2013.01); *H01L 21/486* (2013.01); *H01L 21/4857* (2013.01);
  (Continued)

(58) Field of Classification Search
  CPC . H01L 25/0657; H01L 25/50; H01L 21/4857; H01L 21/486; H01L 21/568;
  (Continued)

(56) References Cited

U.S. PATENT DOCUMENTS 8,518,746 B2   8/2013   Pagaila et al.
8,664,780 B2   3/2014   Han et al.
(Continued)

FOREIGN PATENT DOCUMENTS

TW   201709473   3/2017
TW   201834090   9/2018
(Continued)

OTHER PUBLICATIONS

"Office Action of Taiwan Counterpart Application", dated Oct. 15, 2020, p. 1-p. 5.

*Primary Examiner* — Matthew E. Gordon
(74) *Attorney, Agent, or Firm* — JCIPRNET

(57) ABSTRACT

A semiconductor package and a manufacturing method thereof are provided. The semiconductor package includes a first redistribution structure, a second redistribution structure, a first semiconductor die, a second semiconductor die and an encapsulant. The second redistribution structure is vertically overlapped with the first redistribution structure. The first and second semiconductor dies are located between the first and second redistribution structures, and respectively have an active side and a back side opposite to the active side, as well as a conductive pillar at the active side. The back side of the first semiconductor die is attached to the back side of the second semiconductor die. The conductive pillar of the first semiconductor die is attached to the first redistribution structure, whereas the conductive pillar of the second semiconductor die extends to the second redistribution structure.

17 Claims, 15 Drawing Sheets

(51) Int. Cl.
*H01L 23/31* (2006.01)
*H01L 23/538* (2006.01)
*H01L 23/498* (2006.01)
*H01L 23/367* (2006.01)
*H01L 21/48* (2006.01)
*H01L 21/683* (2006.01)
*H01L 25/00* (2006.01)
*H01L 21/56* (2006.01)

(52) U.S. Cl.
CPC ........ *H01L 21/568* (2013.01); *H01L 21/6835* (2013.01); *H01L 23/3128* (2013.01); *H01L 23/367* (2013.01); *H01L 23/49816* (2013.01); *H01L 23/5384* (2013.01); *H01L 23/5385* (2013.01); *H01L 23/5386* (2013.01); *H01L 24/16* (2013.01); *H01L 24/32* (2013.01); *H01L 24/33* (2013.01); *H01L 24/73* (2013.01); *H01L 24/81* (2013.01); *H01L 24/83* (2013.01); *H01L 24/92* (2013.01); *H01L 25/50* (2013.01); *H01L 2221/68345* (2013.01); *H01L 2221/68359* (2013.01); *H01L 2221/68372* (2013.01); *H01L 2224/16227* (2013.01); *H01L 2224/16237* (2013.01); *H01L 2224/32145* (2013.01); *H01L 2224/33181* (2013.01); *H01L 2224/73203* (2013.01); *H01L 2224/73253* (2013.01); *H01L 2224/81005* (2013.01); *H01L 2224/83005* (2013.01); *H01L 2224/92125* (2013.01); *H01L 2224/92143* (2013.01); *H01L 2224/92225* (2013.01); *H01L 2224/92242* (2013.01); *H01L 2225/06517* (2013.01); *H01L 2225/06548* (2013.01); *H01L 2225/06562* (2013.01); *H01L 2225/06589* (2013.01)

(58) Field of Classification Search
CPC . H01L 21/56; H01L 21/6835; H01L 23/3128; H01L 23/367; H01L 23/49816; H01L 23/5384; H01L 23/5385; H01L 23/5386; H01L 23/28; H01L 23/293; H01L 23/3135; H01L 23/3121; H01L 24/16; H01L 24/32; H01L 24/73; H01L 24/81; H01L 24/83; H01L 24/92; H01L 2224/023; H01L 2224/0231; H01L 2224/02331; H01L 2224/0237; H01L 2224/02371; H01L 2224/02372; H01L 2224/02373; H01L 2224/06181; H01L 2225/06558; H01L 2225/06562
See application file for complete search history.

(56) References Cited

U.S. PATENT DOCUMENTS

| | | | |
|---|---|---|---|
| 2007/0035015 | A1* | 2/2007 | Hsu ..................... H01L 23/5389 257/723 |
| 2013/0313716 | A1* | 11/2013 | Mohammed ...... H01L 21/76877 257/774 |
| 2017/0278821 | A1* | 9/2017 | Zhao ..................... H01L 25/105 |
| 2018/0342489 | A1 | 11/2018 | Yazdani |
| 2021/0066247 | A1* | 3/2021 | Fujisawa ................ H01L 24/48 |

FOREIGN PATENT DOCUMENTS

| | | |
|---|---|---|
| TW | 201903997 | 1/2019 |
| TW | 201921625 | 6/2019 |
| TW | 201943039 | 11/2019 |

\* cited by examiner

SEMICONDUCTOR PACKAGE INCLUDING OFFSET STACK OF SEMICONDUCTOR DIES BETWEEN FIRST AND SECOND REDISTRIBUTION STRUCTURES, AND MANUFACTURING METHOD THEREFOR

BACKGROUND

Technical Field

The present disclosure relates to a semiconductor package and a manufacturing method thereof, and particularly, to a semiconductor package including a die stack and a manufacturing method thereof.

Description of Related Art

Fan-out semiconductor packaging is a packaging process in which contacts of a semiconductor die are redistributed over a larger area through a redistribution layer. The fan-out semiconductor packaging provides a solution for packaging semiconductor devices that require higher integration level and greater number of external contacts. However, semiconductor dies are typically disposed side by side in a fan-out semiconductor package, thus scaling of the fan-out semiconductor package is limited.

SUMMARY

Accordingly, the present disclosure provides a semiconductor package and a manufacturing method thereof, of which semiconductor dies are stacked on one another.

According to some embodiments, a semiconductor package includes a first redistribution structure, a second redistribution structure, a first semiconductor die, a second semiconductor die and an encapsulant. The second redistribution structure is vertically overlapped with the first redistribution structure. The first and second semiconductor dies are located between the first and second redistribution structures, and respectively have an active side and a back side opposite to the active side, as well as a conductive pillar at the active side. The back side of the first semiconductor die is attached to the back side of the second semiconductor die. The conductive pillar of the first semiconductor die is attached to the first redistribution structure, whereas the conductive pillar of the second semiconductor die extends to the second redistribution structure.

In some embodiments, the semiconductor package further includes an additional first semiconductor die and an additional second semiconductor die. The additional first semiconductor die has an active side and a back side opposite to the active side, and has a conductive pillar at the active side. The back side of the additional first semiconductor die is attached to an open area of the active side of the first semiconductor die that is free of the conductive pillar, and the conductive pillar of the additional first semiconductor die is attached to the first redistribution structure. The additional second semiconductor die has an active side and a back side opposite to the active side, and has a conductive pillar at the active side. The back side of the additional second semiconductor die is attached to an open area of the active side of the second semiconductor die that is free of the conductive pillar, and the conductive pillar of the additional second semiconductor die extends to the second redistribution structure.

In some embodiments, the conductive pillar of the first semiconductor die is located outside a span of the additional first semiconductor die, and the additional first semiconductor die is partially overlapped with the first semiconductor die. The conductive pillar of the second semiconductor die is located outside a span of the additional second semiconductor die, and the additional second semiconductor die is partially overlapped with the second semiconductor die.

In some embodiments, the conductive pillar of the first semiconductor die is located within a peripheral region of the first semiconductor die, and the conductive pillar of the second semiconductor die is located within a peripheral region of the second semiconductor die.

In some embodiments, the additional first semiconductor die is offset from the first semiconductor die along a first direction that is opposite to a second direction along which the additional second semiconductor die is offset from the second semiconductor die.

In some embodiments, the additional first semiconductor die is offset from the first semiconductor die along a direction that is identical with a direction along which the additional second semiconductor die is offset from the second semiconductor die.

In some embodiments, the semiconductor package further includes a first die attach film and a second die attach film. The first die attach film is disposed between the first semiconductor die and the additional first semiconductor die. The second die attach film is disposed between the second semiconductor die and the additional second semiconductor die.

In some embodiments, the semiconductor package further includes a third semiconductor die. The third semiconductor die is located between the additional second semiconductor die and the second redistribution structure, and respectively has an active side and a back side opposite to the active side, as well as a conductive pillar at the active side. The back side of the third semiconductor die is attached to an open area of the active side of the additional second semiconductor die that is free of the conductive pillar, and the conductive pillar of the third semiconductor die extends to the second redistribution structure.

In some embodiments, the third semiconductor die is smaller than the additional second semiconductor die, and substantially the whole back side of the third semiconductor die is attached to the additional second semiconductor die.

In some embodiments, the semiconductor package further includes a through encapsulant via. The through encapsulant via penetrates through the encapsulant and electrically connects to the first and second redistribution structures.

In some embodiments, the semiconductor package further includes a plurality of electrical connectors. The electrical connectors are disposed at a surface of the second redistribution structure that is facing away from the encapsulant.

In some embodiments, the semiconductor package further includes a thermal dissipation structure. The thermal dissipation structure is disposed at a surface of the first redistribution structure that is facing away from the encapsulant.

According to some embodiments, a manufacturing method of a semiconductor package includes: forming a first redistribution structure over a carrier; attaching a first semiconductor die onto the first redistribution structure, wherein the first semiconductor die has an active side facing toward the first redistribution structure and a back side opposite to the active side, and has a conductive pillar located at the active side of the first semiconductor die and attached to the first redistribution structure; attaching a second semiconductor die onto the first semiconductor die, wherein the second semiconductor die has an active side facing away from the first redistribution structure and a back side opposite to the active side, and has a conductive pillar at the active side of the second semiconductor die and extend away from the first redistribution structure; laterally encapsulating the first and second semiconductor dies with an encapsulant; forming a second redistribution structure on the encapsulant, wherein the second redistribution structure is electrically connected with the conductive pillar of the second semiconductor die; and detaching the carrier.

In some embodiments, the manufacturing method of the semiconductor package further includes: attaching an additional first semiconductor die onto the first redistribution structure before attaching the first semiconductor die onto the first redistribution structure, wherein the additional first semiconductor die has an active side facing toward the first redistribution structure and a back side opposite to the active side, as well as a conductive pillar located at the active side of the additional first semiconductor die and attached to the first redistribution structure, an open area of the active side of the first semiconductor die is attached with the back side of the additional first semiconductor die; and attaching an additional second semiconductor die onto the second semiconductor die after attaching the second semiconductor die onto the first semiconductor die, wherein the additional second semiconductor die has an active side facing away from the first redistribution structure and a back side opposite to the active side, as well as a conductive pillar located at the active side of the additional second semiconductor die and extending away from the first redistribution structure, an open area of the second semiconductor die is attached with the back side of the additional second semiconductor die.

In some embodiments, the additional first semiconductor die and the additional second semiconductor die are also laterally encapsulated by the encapsulant during the step of encapsulating the first and second semiconductor dies.

In some embodiments, the manufacturing method of the semiconductor package further includes: attaching a third semiconductor die onto the additional second semiconductor die after attaching the additional second semiconductor die onto the second semiconductor die, wherein the third semiconductor die has an active side facing away from the first redistribution structure and a back side opposite to the active side, as well as a conductive pillar located at the active side of the additional second semiconductor die and extending away from the first redistribution structure, the third semiconductor die is smaller than the additional second semiconductor die, and substantially the whole back side of the third semiconductor die is attached onto the additional second semiconductor die.

In some embodiments, the manufacturing method of the semiconductor package further includes: forming a through encapsulant via in the encapsulant after laterally encapsulating the first and second semiconductor dies with the encapsulant, wherein the through encapsulant via penetrates through the encapsulant, and is electrically connected with the first redistribution structure.

In some embodiments, the manufacturing method of the semiconductor package further includes: forming a through encapsulant via on the first redistribution structure before laterally encapsulating the first and second semiconductor dies with the encapsulant, wherein the through encapsulant via is also laterally encapsulated by the encapsulant during the step of laterally encapsulating the first and second semiconductor dies with the encapsulant.

In some embodiments, the manufacturing method of the semiconductor package further includes: forming a plurality of electrical connectors at a surface of the second redistribution structure that is facing away from the encapsulant after the step of forming the second redistribution structure.

In some embodiments, the manufacturing method of the semiconductor package further includes: disposing a thermal dissipation structure at a surface of the first redistribution structure that is facing away from the encapsulant after the step of forming the second redistribution structure.

As above, the semiconductor package according to some embodiments in the present disclosure includes a stack of the semiconductor dies including the first semiconductor dies and the second semiconductor dies laterally encapsulated in the encapsulant, and includes the first redistribution structure and the second redistribution structure at opposite sides of the encapsulant. In this way, a stress induced by a coefficient of thermal expansion (CTE) difference between the first redistribution structure and the encapsulant may be at least partially cancelled by the stress induced by a CTE difference between the second redistribution structure and the encapsulant. Therefore, the semiconductor package is less susceptible to a warpage problem, and the electrical connectors formed over the second redistribution structure may be better attached to the second redistribution structure. In addition, the active sides of the first semiconductor dies in the stack of the semiconductor dies face toward the first redistribution structure, and the conductive pillars at the active sides of the first semiconductor dies are attached and electrically connected to the first redistribution structure. On the other hand, the active sides of the second semiconductor dies face toward the second redistribution structure, and the conductive pillars at the active sides of the second semiconductor dies extend and electrically connect to the second redistribution structure. As such, out-routing and communication of the first semiconductor dies and the second semiconductor dies can be realized through their conductive pillars and the first and second redistribution structures without help of through silicon vias (TSV), and a manufacturing cost of the semiconductor package can be reduced.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
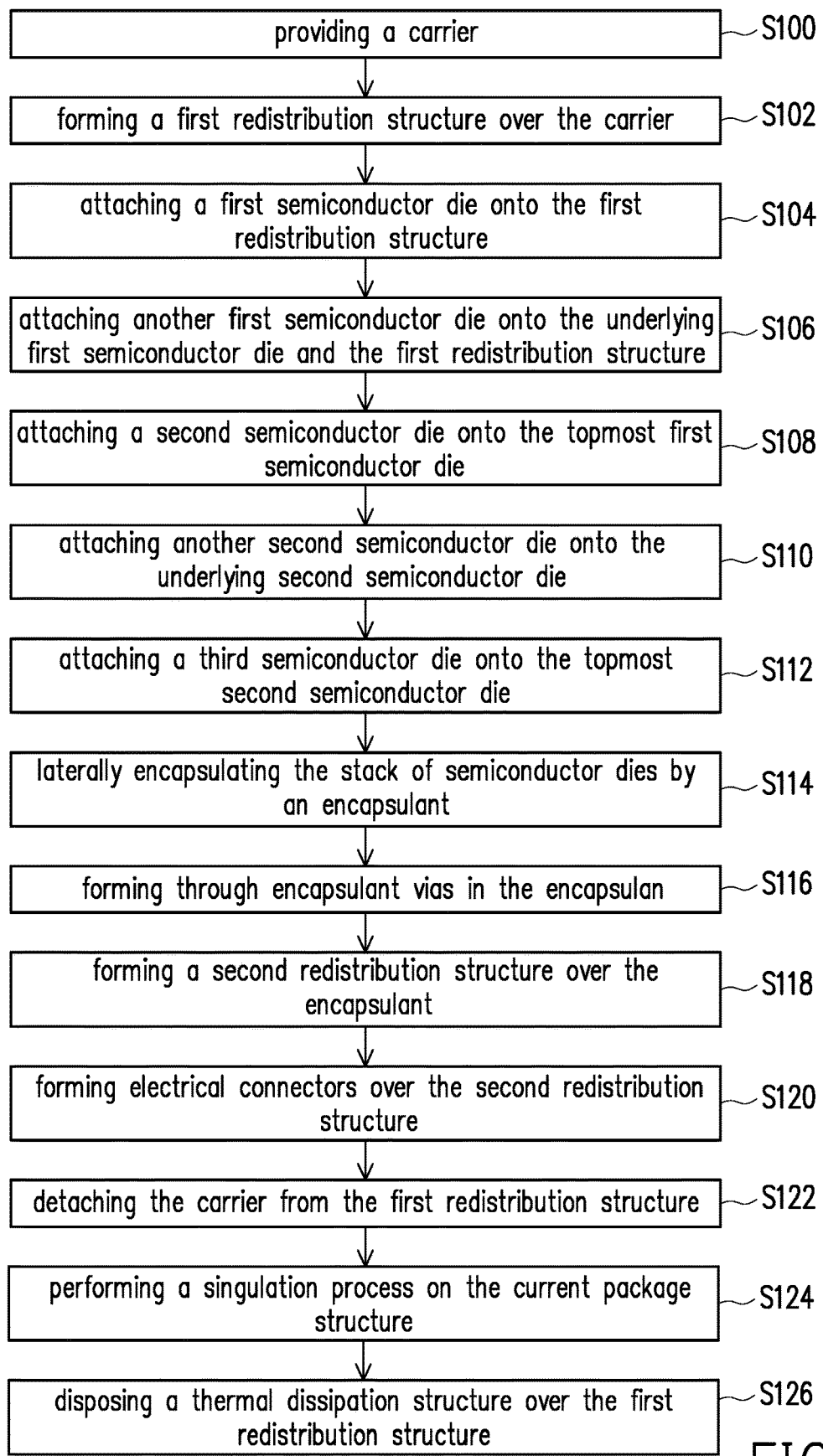
FIG. 1 is a flow diagram illustrating a manufacturing method of a semiconductor package according to some embodiments of the present disclosure.

FIG. 1 is a flow diagram illustrating a manufacturing method of a semiconductor package according to some embodiments of the present disclosure. FIG. 2A through FIG. 2M are schematic cross-sectional views illustrating structures at various stages during the manufacturing method of the semiconductor package as shown in FIG. 1.

Figure 2A:
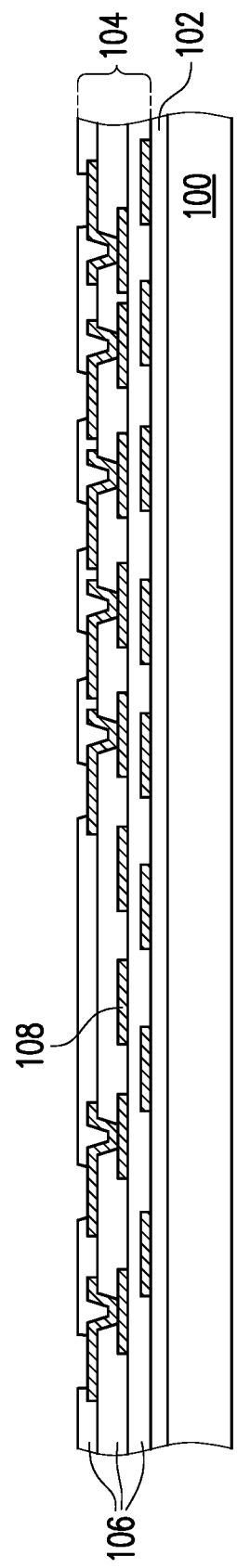
FIG. 2A through FIG. 2M are schematic cross-sectional views illustrating structures at various stages during the manufacturing method of the semiconductor package as shown in FIG. 1.

Referring to FIG. 1 and FIG. 2A, step S100 is performed, and a carrier 100 is provided. The carrier 100 is, for example, a glass carrier. In addition, the carrier 100 may be a panel-level carrier, and may have a rectangular top view shape. In some embodiments, an area of the carrier 100 is about 2500 cm$^2$. In addition, in some embodiments, an insulating layer 102 is formed on a surface of the carrier 100 at which a first redistribution structure 104 to be formed in the following step (e.g., step S102 as describe hereafter). The insulating layer 102 may be a multilayer structure including a release layer and a dielectric layer covering the release layer (both not shown). For instance, the release layer may be a thermal release layer or a light-to-heat-conversion (LTHC) layer, whereas the dielectric layer may be a die attach film. Alternatively, the insulating layer 102 may be a single release layer.

Figure 2B:
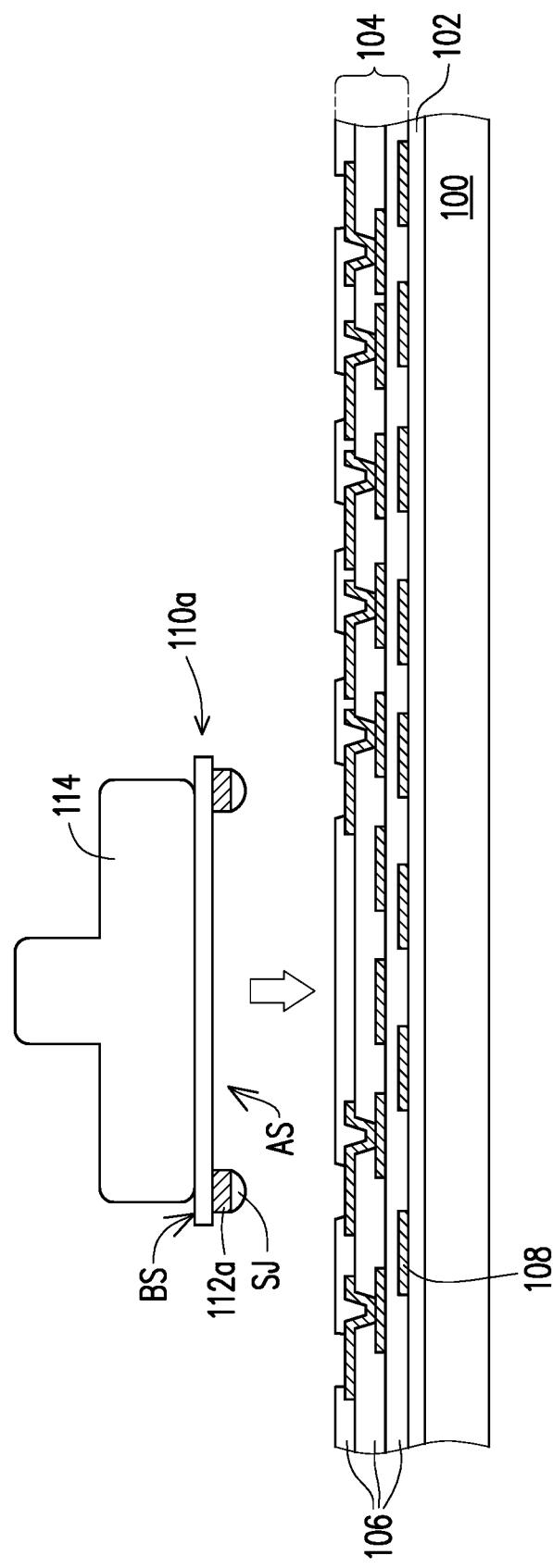
Figure 2C:
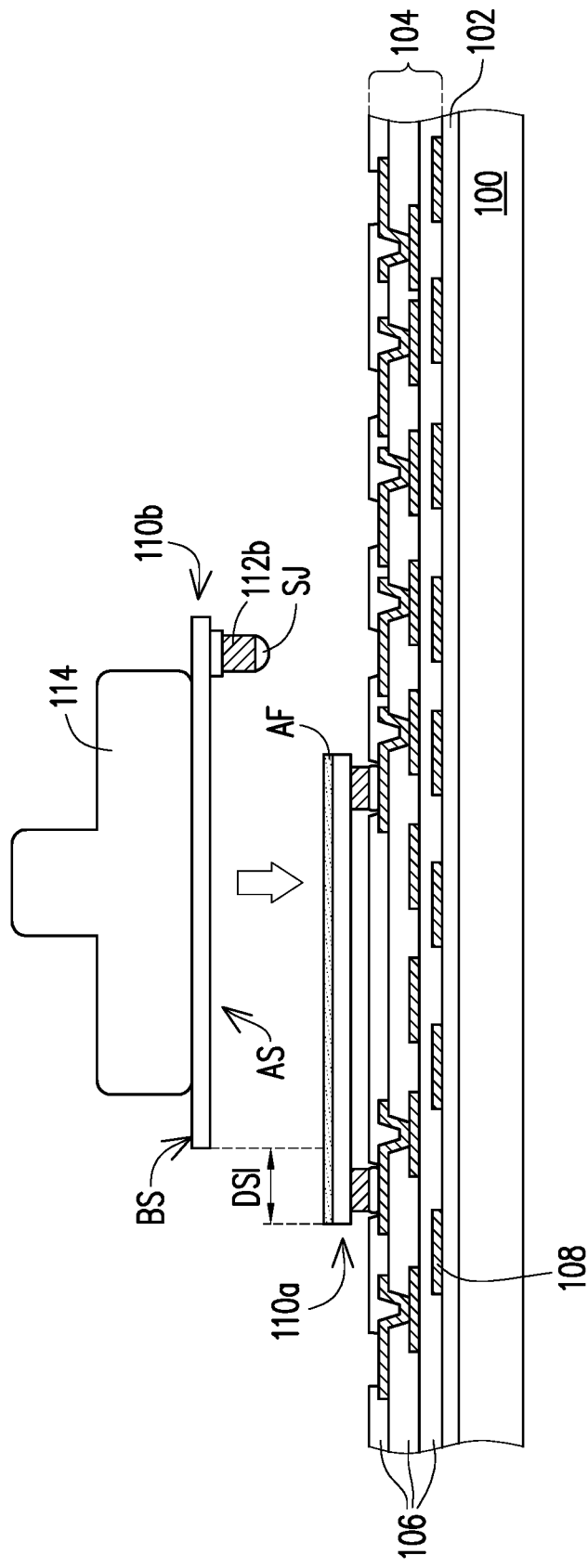
Figure 2D:
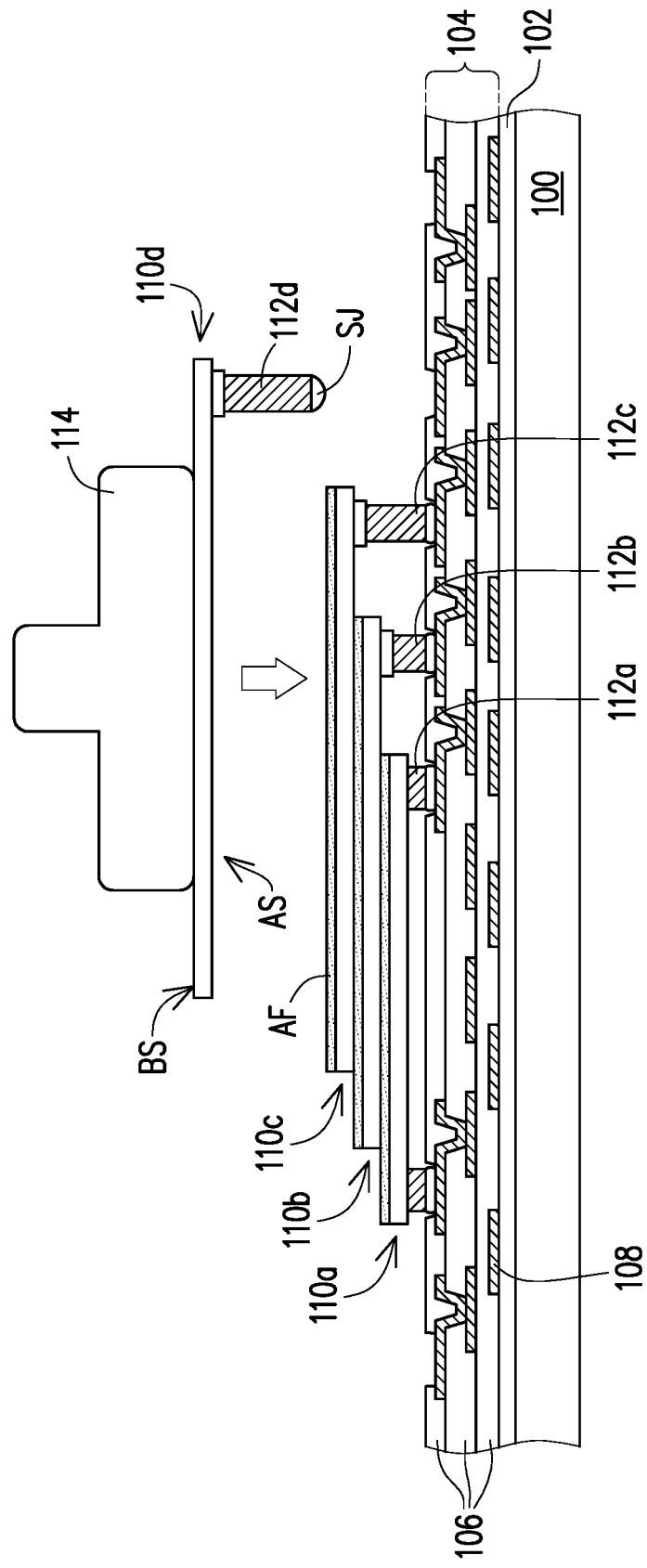

Subsequently, step S102 is performed, and a first redistribution structure 104 is formed over the carrier 100. In those embodiments where the insulating layer 102 is performed over the carrier 100, the insulating layer 102 is currently covered by the first redistribution structure 104. The first redistribution structure 104 may include a stack of dielectric layers 106 (e.g., 3 of the dielectric layers 106), and include redistribution elements 108 formed in the stack of the dielectric layers 106. The redistribution elements 108 may respectively include a conductive trace, a conductive via or a combination thereof. The conductive trace extends along one or more directions over one of the dielectric layers 106, whereas the conductive via penetrates one of the dielectric layers 106 and electrically connects to at least one of the conductive traces. In some embodiments, openings are formed in the topmost dielectric layer 106, so as to expose the topmost redistribution elements 108. In this way, those exposed redistribution elements can be attached with other components including, for example, the first semiconductor dis 110a-110d as shown in FIG. 2B through FIG. 2D and the through encapsulant vias 126 as shown in FIG. 2I. In some embodiments, a material of the dielectric layers 106 includes a polymer material, whereas a material of the redistribution elements 108 includes a metal or a metal alloy. For instance, the polymer material includes polyimide, polybenzoxazole (PBO), benzocyclobutene (BCB), the like or a combination thereof, and the metal/metal alloy includes copper, nickel, titanium, the like or a combination thereof. In alternative embodiments, the dielectric layers 106 are inorganic insulating layers, and are made of, for example, silicon oxide, silicon nitride or the like.

Referring to FIG. 1 and FIG. 2B, step S104 is performed, and first semiconductor dies 110a are attached onto the first redistribution structure 104. It should be noted that, only a single one of the first semiconductor dies 110a is depicted in FIG. 2B, whereas others of the first semiconductor dies 110a (not shown) may be separately attached onto the first redistribution structure 104. In some embodiments, the first semiconductor dies 110a are respectively a logic die, a memory die, an application-specific die or the like. The first semiconductor die 100a as well as the semiconductor dies to be described in the present disclosure respectively has an active side AS at which electronic devices (including active devices and/or passive devices) and interconnections (both not shown) are formed, and has a back side BS facing away from the active side AS. The active side AS of the first semiconductor die 110a faces toward the first redistribution structure 104, whereas the back side BS of the first semiconductor die 110b faces away from the first redistribution structure 104. In some embodiments, the first semiconductor die 110a has a plurality of conductive pillars 112a formed at the active side AS of the first semiconductor die 110a, and the conductive pillars 112a are electrically connected to the interconnections of the first semiconductor die 110a (not shown). In these embodiments, the conductive pillars 112a are exposed at the active side AS of the first semiconductor die 110a, and may be considered as protruding portions of the first semiconductor die 110a. The first semiconductor die 110a is attached onto the first redistribution structure 104 by a flip chip bonding manner, and is electrically connected with some of the exposed redistribution elements 108 through the conductive pillars 112a. In some embodiments, the first semiconductor die 110a is picked from a singulated device wafer (not shown), and placed onto the first redistribution structure 104 by using, for example, a pick-and-place apparatus 114. The conductive pillars 112a of the first semiconductor die 110a are placed in some of the openings of the topmost dielectric layer 106, and attached with the exposed redistribution elements 108 in these openings. In some embodiments, solder joints SJ are attached between the conductive pillars 112a and the corresponding redistribution elements 108. The solder joints SJ may be respectively formed on the conductive pillars 112a before the attachment of the first semiconductor die 110a and the first redistribution structure 104. Alternatively, the solder joints SJ may be formed on the exposed redistribution elements 108 before the attachment of the first semiconductor die 110a and the first redistribution structure 104.

Referring to FIG. 1 and FIG. 2C, step S106 is performed, and first semiconductor dies 110b are respectively attached onto one of the first semiconductor dies 110a and the first redistribution structure 104 by using, for example, a pick-and-place apparatus 114. The first semiconductor die 110b is similar to the first semiconductor die 110a, except that conductive pillars 112b of the first semiconductor die 110b (only one of the conductive pillars 112b is shown in FIG. 2C) may be formed within a peripheral region of the first semiconductor die 110b. In addition, a height of the conductive pillars 112b of the first semiconductor dies 110b may be greater than a height of the conductive pillars 112a of the first semiconductor dies 110a. The first semiconductor die 110b is offset from the underlying first semiconductor die 110a, such that the conductive pillars 112b of the semiconductor die 110b are located outside the span of the underlying first semiconductor die 110a. In this way, the conductive pillars 112b can be attached to the first redistribution structure 104, whereas an open area of the active side AS of the first semiconductor die 110b not having the conductive pillars 112b is attached onto the underlying first semiconductor die 110a. In addition, the first semiconductor die 110b is partially overlapped with the underlying first semiconductor die 110a. In some embodiments, the first semiconductor die 110b is offset from the underlying first semiconductor die 110a by a distance DS1 ranging from 1000 μm to 3 mm. In addition, in some embodiments, a die attach film AF is pre-formed (e.g., by lamination process or solution process) on the back side BS of the first semiconductor die 110a, and the open area of the active side AS of the first semiconductor die 110b not having the conductive pillars 112b is attached onto the back side BS of the underlying first semiconductor die 110a through the die attach film AF. On the other hand, the conductive pillars 112b are attached to some of the exposed redistribution elements 108 through solder joints SJ. The solder joints SJ may be pre-formed on the conductive pillars 112b or the exposed redistribution elements 108 before the attachment of the conductive pillars 112b and these redistribution elements 108.

Referring to FIG. 1 and FIG. 2D, in some embodiments, step 106 is repeated at least once. For instance, step S106 is repeated twice, and first semiconductor dies 110c are respectively attached onto one of the first semiconductor dies 110b and the first redistribution structure 104, then first semiconductor dies 110d are respectively attached onto one of the first semiconductor dies 110c and the first redistribution structure 104. The first semiconductor dies 110c and the first semiconductor dies 110d are similar to the first semiconductor dies 110b, and may be picked from a singulated device wafer (not shown) and attached onto the structure shown in FIG. 2C by using, for example, a pick-and-place apparatus 114. As similar to the configuration of the first semiconductor die 110b and the underlying first semiconductor die 110a, the first semiconductor die 110c is offset from the underlying first semiconductor die 110b, and the first semiconductor die 110d is offset from the underlying first semiconductor die 110c. In this way, conductive pillars 112c of the first semiconductor die 110c are located outside the span of the underlying first semiconductor die 110b, and can be attached with the first redistribution structure 104. Similarly, conductive pillars 112d of the first semiconductor die 110d are located outside the span of the underlying first semiconductor die 110c, and can be attached with the first redistribution structure 104. In some embodiments, the first semiconductor dies 110a-110d are respectively offset from the underlying first semiconductor die along the same direction by the same or different distance, and the conductive pillars 112a-112d of the first semiconductor dies 110a-110d are located in the same half part of the stack of the first semiconductor dies 110a-110d. For instance, the first semiconductor dies 110a-110d are respectively offset toward a left side of the underlying first semiconductor die, and the conductive pillars 112a-112d are all located within a right half part of the stack of the first semiconductor dies 110a-110d. Moreover, a height of the conductive pillars of the overlying first semiconductor die (e.g., the conductive pillars 112d of the first semiconductor die 110d) is greater than a height of the conductive pillar of the underlying first semiconductor die (e.g., the conductive pillar 112c of the first semiconductor die 110c) because of a greater vertical spacing between the overlying first semiconductor die and the first redistribution structure 104. In addition, in some embodiments, the conductive pillars 112c and the conductive pillars 112d are attached to the exposed redistribution elements 108 through solder joints SJ that are pre-formed on the conductive pillars 112c/112d or on these redistribution elements 108. On the other hand, a die attach film AF may be pre-formed (e.g., by a lamination process or a solution process) over the back side BS of the underlying first semiconductor die (e.g., the first semiconductor die 110b), and an open area of the active side AS of the overlying first semiconductor die (e.g., the first semiconductor die 110c) not having the conductive pillars may be attached with the underlying first semiconductor die (e.g., the first semiconductor die 110b) through the die attach film AF.

In some embodiments, step S106 is repeated more than two times, and more of the first semiconductor dies are attached onto the structure shown in FIG. 2D.

Figure 2E:
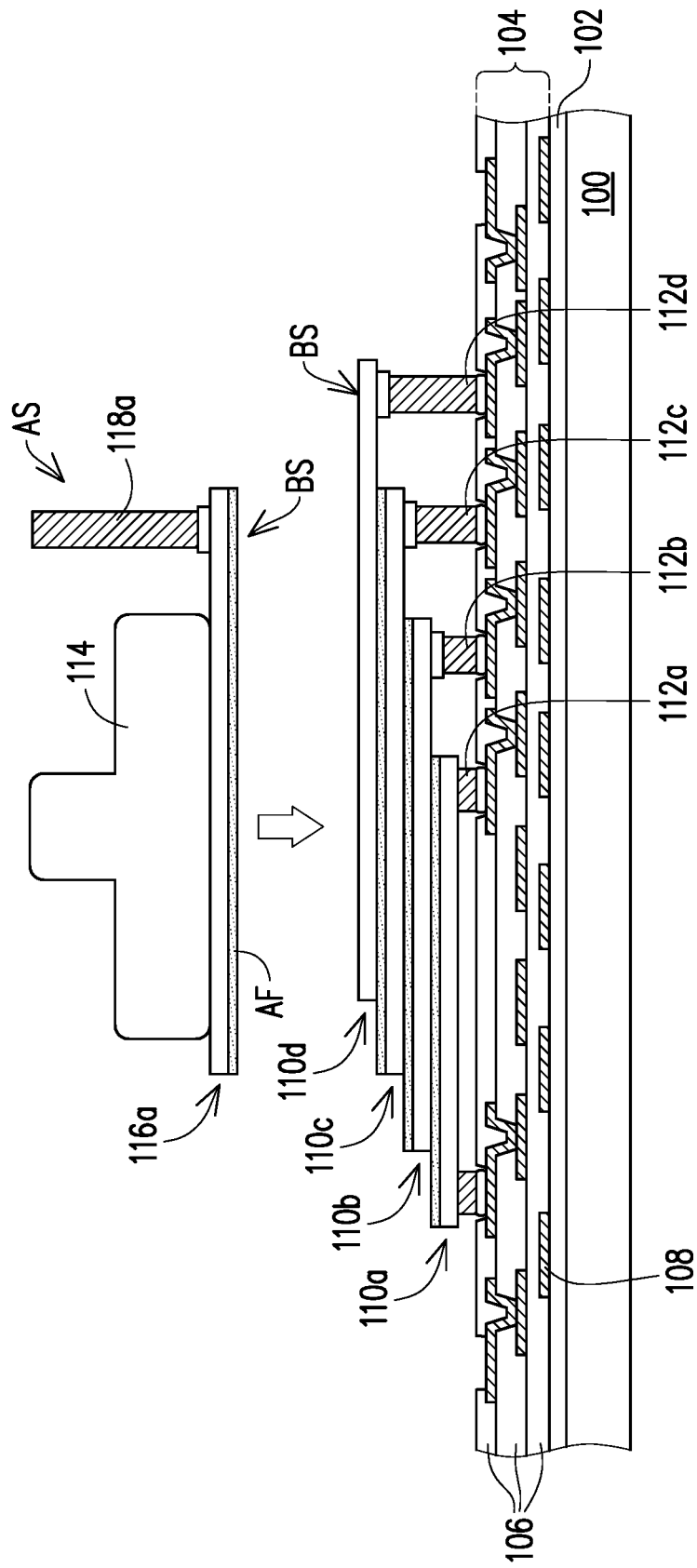

Referring to FIG. 1 and FIG. 2E, step S108 is performed, and second semiconductor dies 116a are respectively attached onto the one of the topmost first semiconductor dies (e.g., the first semiconductor dies 110d) by using, for example, a pick-and-place apparatus 114. The second semiconductor die 116a is similar to the first semiconductor die (e.g., the first semiconductor die 110b), except that the active side AS of the second semiconductor die 116a faces away from the first redistribution structure 104, whereas the back side BS of the second semiconductor die 116a faces toward the first redistribution structure 104. Accordingly, conductive pillars 118a at the active side AS of the second semiconductor die 116a extend away from the first redistribution structure 104. In some embodiments, the conductive pillars 118a of the second semiconductor die 116a are disposed within a peripheral region of the second semiconductor die 116a, such that the second semiconductor die 116a can have a sufficiently large open area on which another second semiconductor die can be landed in the following step (e.g., step S110 as illustrated with reference to FIG. 2F). On the other hand, the back side BS of the second semiconductor die 116 is facing toward and attached with the back side BS of the underlying first semiconductor die (e.g., the first semiconductor die 110d). In some embodiments, the second semiconductor die 116a is attached with the underlying first semiconductor die (e.g., the first semiconductor die 110d) through a die attach film AF. The die attach film AF may be pre-formed (e.g., by a lamination process or a solution process) at the back side BS of the second semiconductor die 116a or the back side BS of the underlying first semiconductor die (e.g., the first semiconductor die 110d) before the attachment of the second semiconductor die 116a and the underlying first semiconductor die (e.g., the first semiconductor die 110d). In some embodiments, the second semiconductor die 116a is offset from the underlying first semiconductor die along a direction that is opposite to the direction along which the first semiconductor dies are respectively offset from the underlying first semiconductor die. For instance, as shown in FIG. 2E, the second semiconductor die 116a is offset toward a left side of the underlying first semiconductor die 110d, whereas the first semiconductor die 110d is offset toward a right side of the underlying first semiconductor die 110c.

Figure 2F:
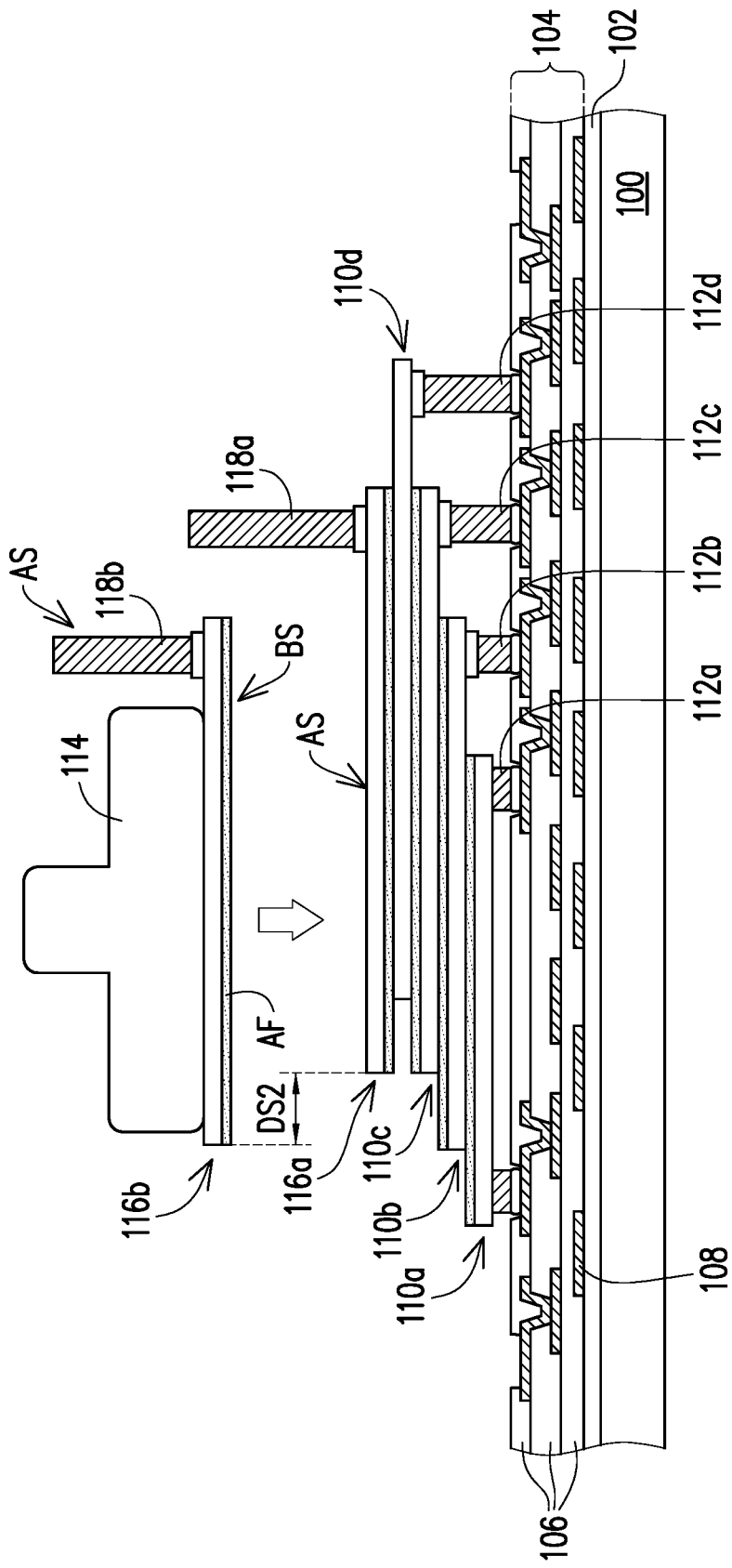

Referring to FIG. 1 and FIG. 2F, step S110 is performed, and second semiconductor dies 116b are respectively attached onto one of the second semiconductor dies 116a by using, for example, a pick-and-place apparatus 114. The second semiconductor die 116b is similar to the second semiconductor die 116a, and the second semiconductor die 116b is offset from the underlying second semiconductor die 116a, such that the second semiconductor die 116b can be landed on the open area of the underlying second semiconductor die 116a that is free of the conductive pillars 118a. For instance, as shown in FIG. 2F, the second semiconductor die 116b is offset toward a left side of the underlying second semiconductor die 116a by a distance DS2 ranging from 100 μm to 3 mm, and is partially overlapped with the underlying second semiconductor die 116a. Conductive pillars 118b of the second semiconductor die 116b may be located within a peripheral region of the second semiconductor die 116b, and adjacent to the conductive pillars 118a of the underlying second semiconductor die 116a. In some embodiments, as shown in FIG. 2F, the back side BS of the second semiconductor die 116b is attached onto the active side AS of the underlying second semiconductor die 116a through a die attach film AF, which may be pre-formed (e.g., by a lamination process) at the back side BS of the second semiconductor die 116b. In alternative embodiments, even though it is not shown in FIG. 2F, the die attach film AF may be pre-formed (e.g., by a solution process) at the active side AS of the second semiconductor die 116a before attachment of the second semiconductor dies 116a and 116b. In these alternative embodiments, a peripheral region of the second semiconductor die 116*b* that is not overlapped with the underlying second semiconductor die 116*a* may not be covered by the die attach film AF.

Figure 2G:
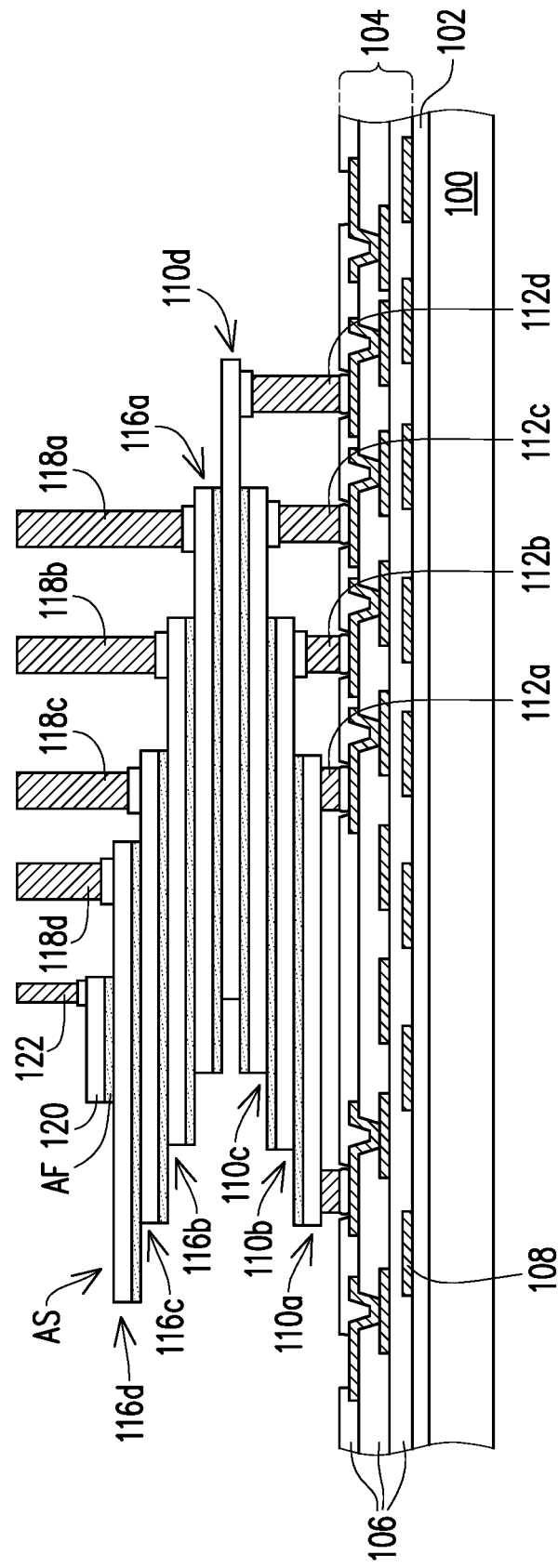

Referring to FIG. 1 and FIG. 2G, step S110 is repeated at least once. For instance, step S110 is repeated twice, and second semiconductor dies 116*c* and second semiconductor dies 116*d* are sequentially placed onto the structure shown in FIG. 2F. The second semiconductor dies 116*c* and the second semiconductor dies 116*d* are similar to the second semiconductor dies 116*b* and the second semiconductor dies 116*a*. The second semiconductor die 116*c* is offset from the underlying second semiconductor die 116*b*, such that the second semiconductor die 116*c* can be landed on the open area of the underlying second semiconductor die 116*b* that is free of the conductive pillars 118*b*. Accordingly, the conductive pillars 118*b* of the second semiconductor die 116*b* are located outside the span of the overlying second semiconductor die 116*c*, and the second semiconductor die 116*b* is partially overlapped with the overlying semiconductor die 116*c*. Similarly, the second semiconductor die 116*d* is offset from the underlying second semiconductor die 116*c*. Therefore, conductive pillars 118*c* of the second semiconductor die 116*c* are located outside the span of the overlying second semiconductor die 116*d*, and the second semiconductor die 116*c* is partially overlapped with the overlying semiconductor die 116*d*. In some embodiments, the second semiconductor dies (e.g., the second semiconductor dies 116*a*-116*d*) are respectively offset from the underlying semiconductor die along the same direction, which may be opposite to the direction along which the first semiconductor dies (e.g., the first semiconductor dies 110*a*-110*d*) are respectively offset from the underlying semiconductor die. For instance, as shown in FIG. 2G, the second semiconductor dies 116*a*-116*d* are respectively offset toward a left side of the underlying semiconductor die, whereas the first semiconductor dies 110*a*-110*d* are respectively offset toward a right side of the underlying semiconductor die. Accordingly, the conductive pillars 118*a*-118*d* of the second semiconductor dies 116*a*-116*d* and the conductive pillars 112*a*-112*d* of the first semiconductor dies 110*a*-110*d* may be located in the same half part (e.g., a right half part) of the stack of semiconductor dies including the first semiconductor dies 110*a*-110*d* and the second semiconductor dies 116*a*-116*d*. In some embodiments, top surfaces of the conductive pillars 118*a*-118*d* are substantially coplanar with one another, thus heights of the conductive pillars 118*a*-118*d* gradually decrease from the height of the conducive pillars 118*a* to the height of the conductive pillars 118*d*. Furthermore, in some embodiments, a die attach films AF is disposed between vertically adjacent second semiconductor dies 110*d* and 110*c*. Similarly, a die attach film AF is disposed between vertically adjacent second semiconductor dies 110*c* and 110*b*. The die attach films AF may be pre-formed (e.g., by a lamination process) at the back side of the overlying one of the vertically adjacent second semiconductor dies before the attachment of these vertically adjacent second semiconductor dies. Alternatively, the die attach film AF may be pre-formed (e.g., by a solution process) at the active side of the underlying one of the vertically adjacent semiconductor dies before attachment of these semiconductor dies.

In some embodiments, step S110 may be repeated more than two times, and more of the second semiconductor dies may be attached onto the second semiconductor dies 116*d*.

In some embodiments, step S112 is performed, and third semiconductor dies 120 are respectively attached onto one of the topmost second semiconductor dies (e.g., the second semiconductor dies 116*d*). The third semiconductor die 120 is similar to the first and second semiconductor dies, except that the third semiconductor die 120 may be smaller than the first and second semiconductor dies. The third semiconductor die 120 is attached onto an open area of the underlying second semiconductor die that is free of the conductive pillars. For instance, the third semiconductor die 120 is attached onto an open area of the underlying second semiconductor die 116*d* that is free of the conductive pillars 118*d*, such that the conductive pillars 118*d* are located outside the span of the overlying third semiconductor die 120. Since the third semiconductor die 120 is smaller than the underlying second semiconductor die (e.g., the second semiconductor die 116*d*), substantially the whole back side BS of the third semiconductor die 120 is overlapped with the underlying second semiconductor die (e.g., the second semiconductor die 116*d*). Conductive pillars 122 of the third semiconductor die 120 extend away from the first redistribution structure 104, and are located aside the conductive pillars of the underlying second semiconductor dies. For instance, the conductive pillars 122 of the third semiconductor die 120 are located at the left side of the conductive pillars 118*a*-118*d* of the underlying second semiconductor dies 116*a*-116*d*. In some embodiments, top surfaces of the conductive pillars 122 are substantially coplanar with the top surfaces of the conductive pillars of the underlying second semiconductor dies (e.g., the conductive pillars 118*a*-118*d* of the second semiconductor dies 116*a*-116*d*). In addition, in some embodiments, the third semiconductor die 120 is attached onto the underlying second semiconductor die (e.g., the second semiconductor die 116*d*) through a die attach film AF, which may be pre-formed (e.g., by a lamination process) at the back side BS of the third semiconductor die 120, or alternatively pre-formed (e.g., by a solution process) at the active side AS of the second semiconductor die 116*d*.

Figure 2H:
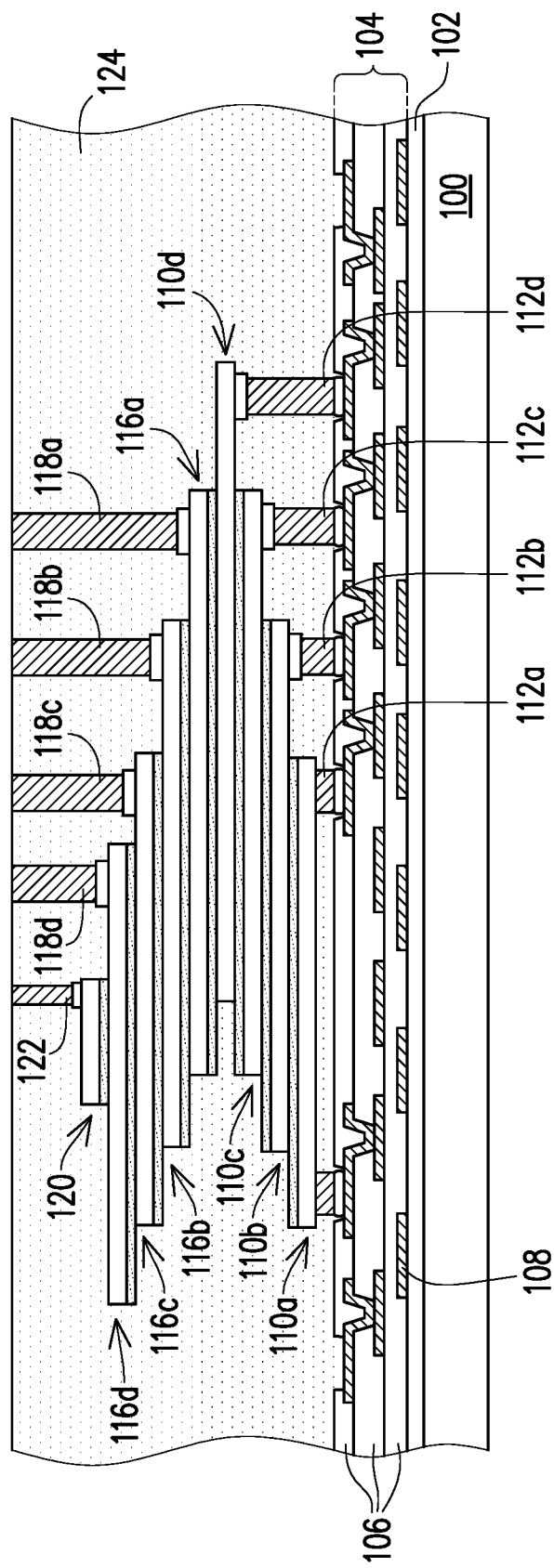
Figure 2I:
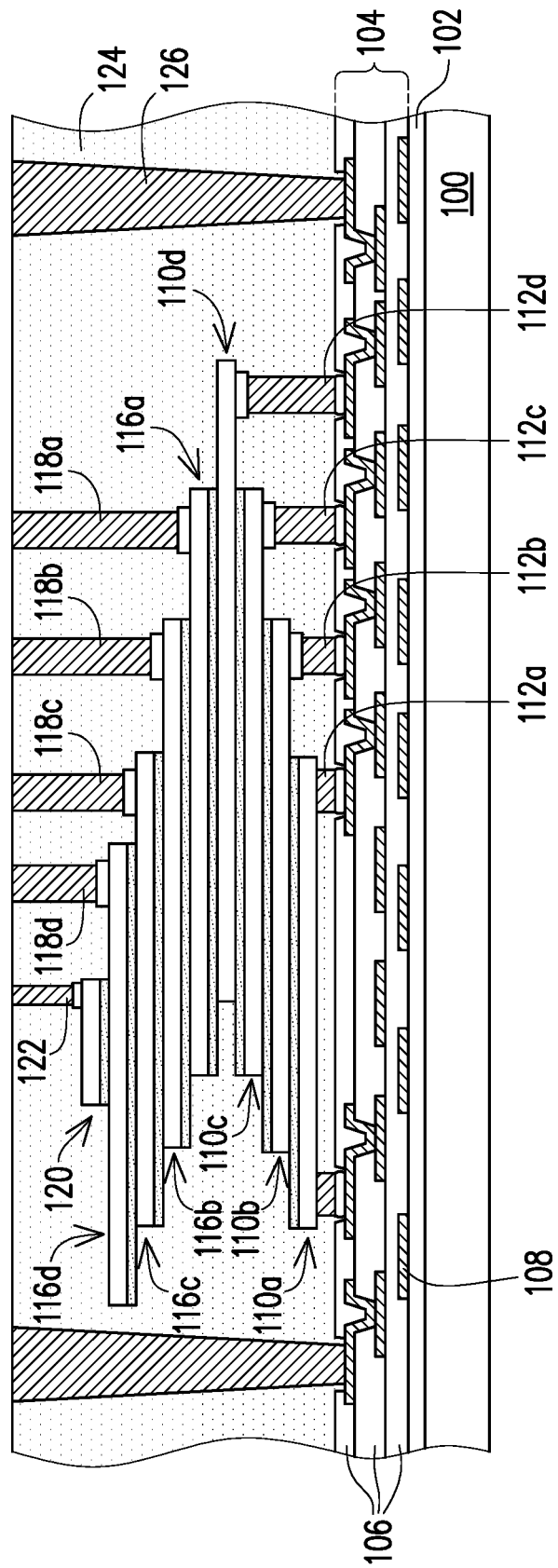

Referring to FIG. 1 and FIG. 2H, step S114 is performed, and a stack of the semiconductor dies (including, for example, the first semiconductor dies 110*a*-110*d*, the second semiconductor dies 116*a*-116*d* and the third semiconductor dies 120) above the first redistribution structure 104 is laterally encapsulated by an encapsulant 124. In some embodiments, the stack of semiconductor dies are initially over-molded by an encapsulating material (not shown), and then a planarization process may be performed on the encapsulating material, in order to expose the conductive pillars of the second semiconductor dies (e.g., the conductive pillars 118*a*-118*d* of the second semiconductor dies 116*a*-116*d*) as well as the conductive pillars of the third semiconductor dies (e.g., the conductive pillars 122 of the third semiconductor dies 120), and to form the encapsulant 124. In certain embodiments, top portions of the conductive pillars of the second semiconductor dies and the third semiconductor dies (e.g., the conductive pillars 118*a*-118*d* of the second semiconductor dies 116*a*-116*d* and the conductive pillars 122 of the third semiconductor dies 120) may be partially removed during the planarization process. In addition, after performing the planarization process, top surfaces of the conductive pillars of the second semiconductor dies and the additional semiconductor dies (e.g., the conductive pillars 118*a*-118*d* of the second semiconductor dies 116*a*-116*d* and the conductive pillars 122 of the third semiconductor dies 120) may be substantially coplanar with a top surface of the encapsulant 124. In some embodiments, a material of the encapsulant 124 may include epoxy resin, polyimide, silicone, the like or a combination thereof, and the planarization process may be a chemical mechanical polishing process, an etching process or a grinding process.

Referring to FIG. 1 and FIG. 2I, step S116 is performed, and through encapsulant vias 126 are formed in the encapsulant 124. The through encapsulant vias 126 penetrate through the encapsulant 124, and electrically connected to some of the topmost redistribution elements 108 in the first redistribution structure 104. Accordingly, signals can be transmitted out of the first semiconductor dies (e.g., the first semiconductor dies 110a-110d) through the first redistribution structure 104 and the through encapsulant vias 126. The stack of semiconductor dies may be located between adjacent through encapsulant vias 126. In some embodiments, a method for forming the through encapsulant vias 126 includes forming through holes in the encapsulant 124 by using a drilling process (e.g., a laser drilling process or a mechanical drilling process) or an etching process. Subsequently, a conductive material may be filled in these through holes by a plating process, a deposition process or a combination thereof. The conductive material may initially extend out of the through holes, and a planarization process may be performed to remove portions of the initially formed conductive material that are above the encapsulant 124, so as to form the through encapsulant vias 126 as shown in FIG. 2I. In these embodiments, the through encapsulant vias 126 may taper toward the first redistribution structure 104. The conductive material may include Cu, Al, Ti, Ni, the like or combinations thereof. The planarization process may include a chemical mechanical polishing process, an etching process, a grinding process or combinations thereof.

According to the afore-described embodiments, the step of forming the through encapsulant vias 126 follows the step of forming the encapsulant 124. However, in alternative embodiments, the step of forming the through encapsulant vias 126 precedes the step of forming the encapsulant 124. In these alternative embodiments, the through encapsulant vias 126 are formed over the first redistribution structure 104, then the formed through encapsulant vias 126 are laterally encapsulated by the encapsulant 124 along with the stack of the semiconductor dies. The present disclosure is not limited to the sequential order of the steps of forming the encapsulant 124 and the through encapsulant vias 126.

Figure 2J:
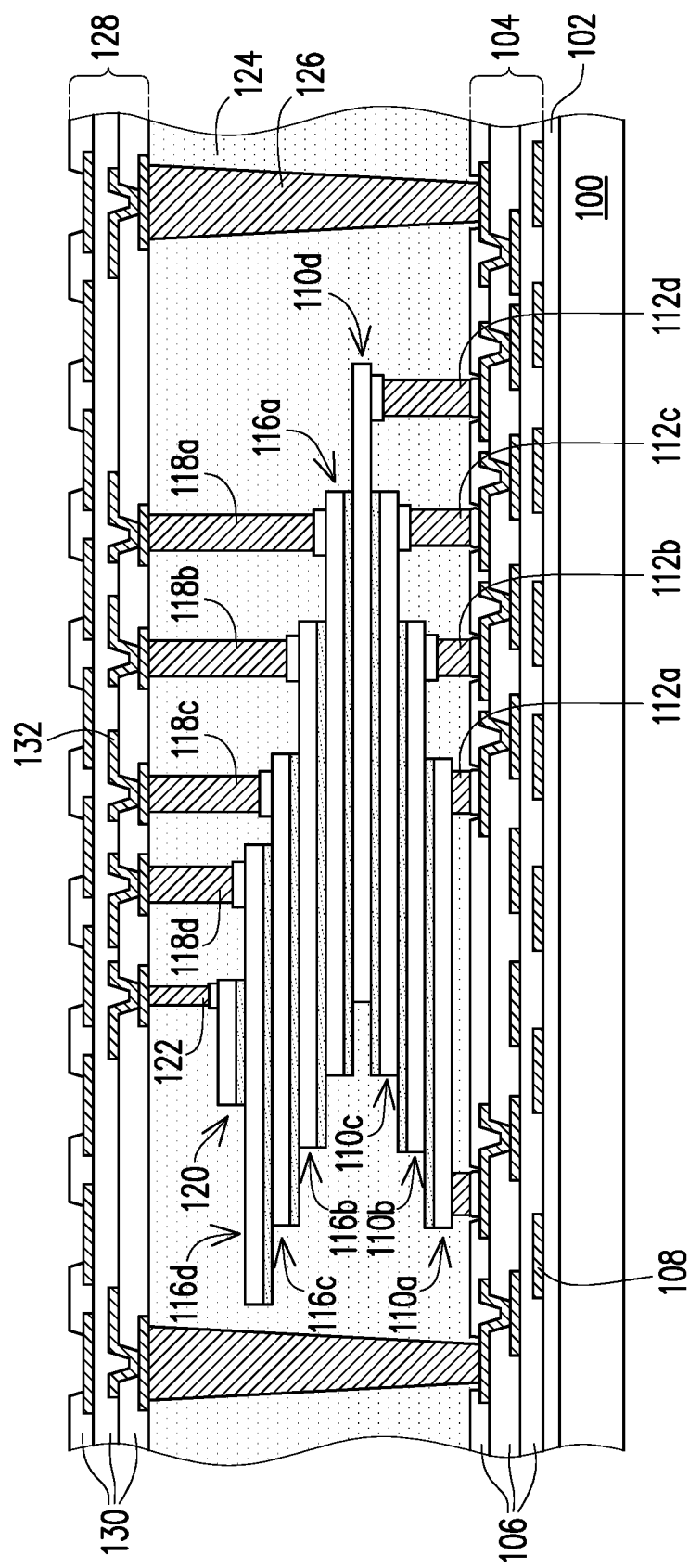

Referring to FIG. 1 and FIG. 2J, step S118 is performed, and a second redistribution structure 128 is formed over the encapsulant 124. The second redistribution structure 128 may include a stack of dielectric layers 130 (e.g., 3 of the dielectric layers 130), and include redistribution elements 132 formed in the stack of the dielectric layers 130. The redistribution elements 132 may respectively include a conductive trace, a conductive via or a combination thereof. The conductive trace extends along one or more directions over one of the dielectric layers 130, whereas the conductive via penetrates one of the dielectric layers 130 and electrically connects to at least one of the conductive traces. The top surfaces of the conductive pillars (e.g., the conductive pillars 118a-118d of the second semiconductor dies 116a-116d as well as the conductive pillars 122 of the third semiconductor dies 120) previously exposed are currently covered by and electrically connected with the bottommost ones of the redistribution elements 132 in the second redistribution structure 128. Accordingly, the signals can be transmitted out of the second semiconductor dies (e.g., the second semiconductor dies 116a-116d) and the third semiconductor dies 120 through the second redistribution structure 128 and the through encapsulant vias 126. In addition, communications between the second semiconductor dies (e.g., the second semiconductor dies 116a-116d), the third semiconductor dies 120 and the first semiconductor dies (e.g., the first semiconductor dies 110a-110d) can be realized by the first redistribution structure 104, the through encapsulant vias 126 and the second redistribution structure 128. In some embodiments, a material of the dielectric layers 130 includes a polymer material, whereas a material of the redistribution elements 132 includes a metal or a metal alloy. For instance, the polymer material includes polyimide, polybenzoxazole (PBO), benzocyclobutene (BCB), the like or a combination thereof, and the metal/metal alloy includes copper, nickel, titanium, the like or a combination thereof. In alternative embodiments, the dielectric layers 130 are inorganic insulating layers, and are made of, for example, silicon oxide, silicon nitride or the like.

Figure 2K:
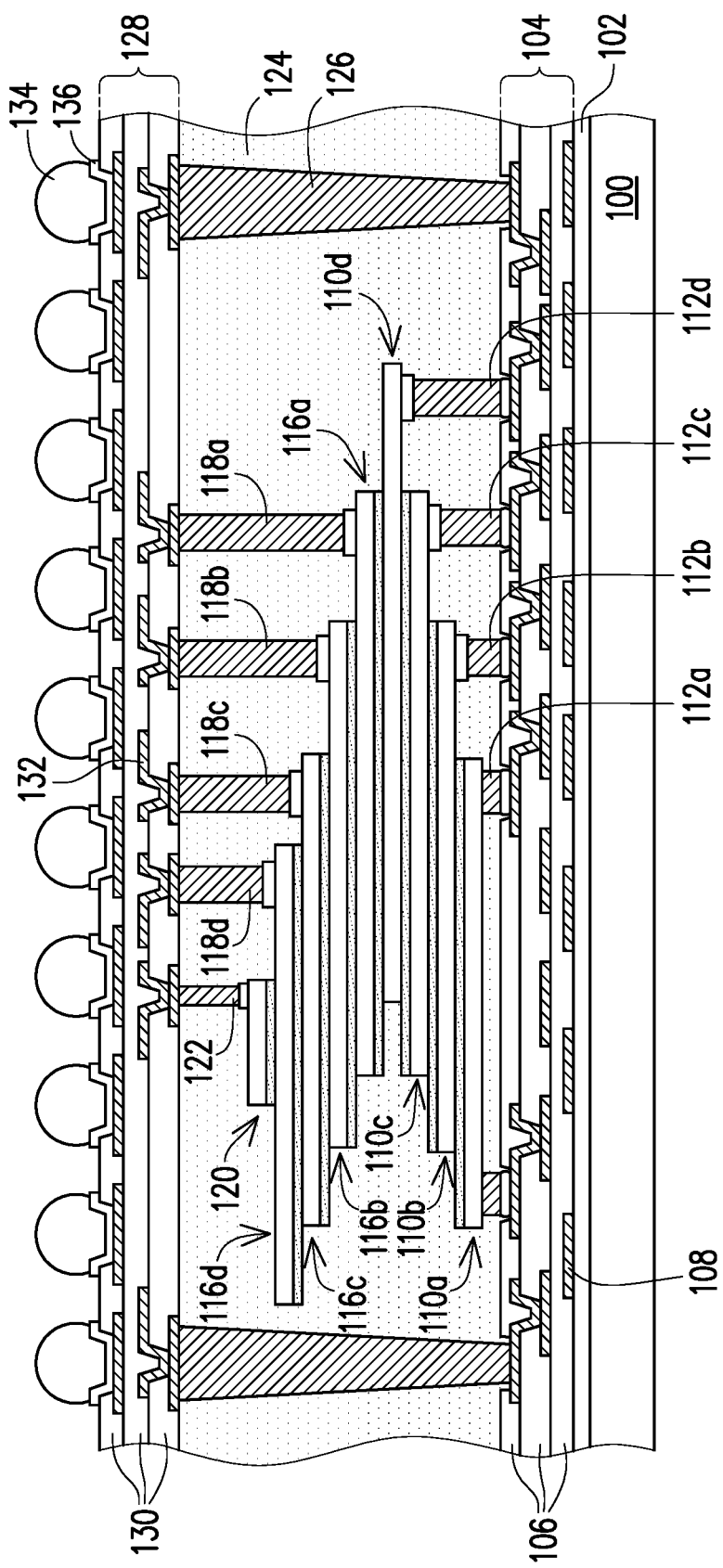

Referring to FIG. 1 and FIG. 2K, step S120 is performed, and electrical connectors 134 are formed over the second redistribution structure 128. The electrical connectors 134 may be regarded as extending into the topmost dielectric layer 130 of the second redistribution structure 128, so as to be electrically connected to the redistribution elements 132 of the second redistribution structure 128. A method for forming the electrical connectors 134 may include removing some portions of the topmost dielectric layer 130 to form openings exposing some portions of the redistribution elements 132. Subsequently, the electrical connectors 134 are respectively disposed over the exposed portions of the redistribution elements 132. In some embodiments, under ball metallization (UBM) layers 136 are respectively formed in the openings of the topmost dielectric layer 130 before disposing the electrical connectors 134. As such, after disposing the electrical connectors 134, the UBM layers 136 are respectively located between the electrical connectors 134 and the second redistribution structure 128. In some embodiments, the UBM layers 136 further extend onto a surface of the topmost dielectric layer 130 outside the afore-mentioned openings. The electrical connectors 134 may include micro-bumps, controlled collapse chip connection (C4) bumps, ball grid array (BGA) balls, solder balls or the like. In addition, a material of the UBM layer 136 may include Cr, Cu, Ti, W, Ni, Al, the like or combinations thereof.

Figure 2L:
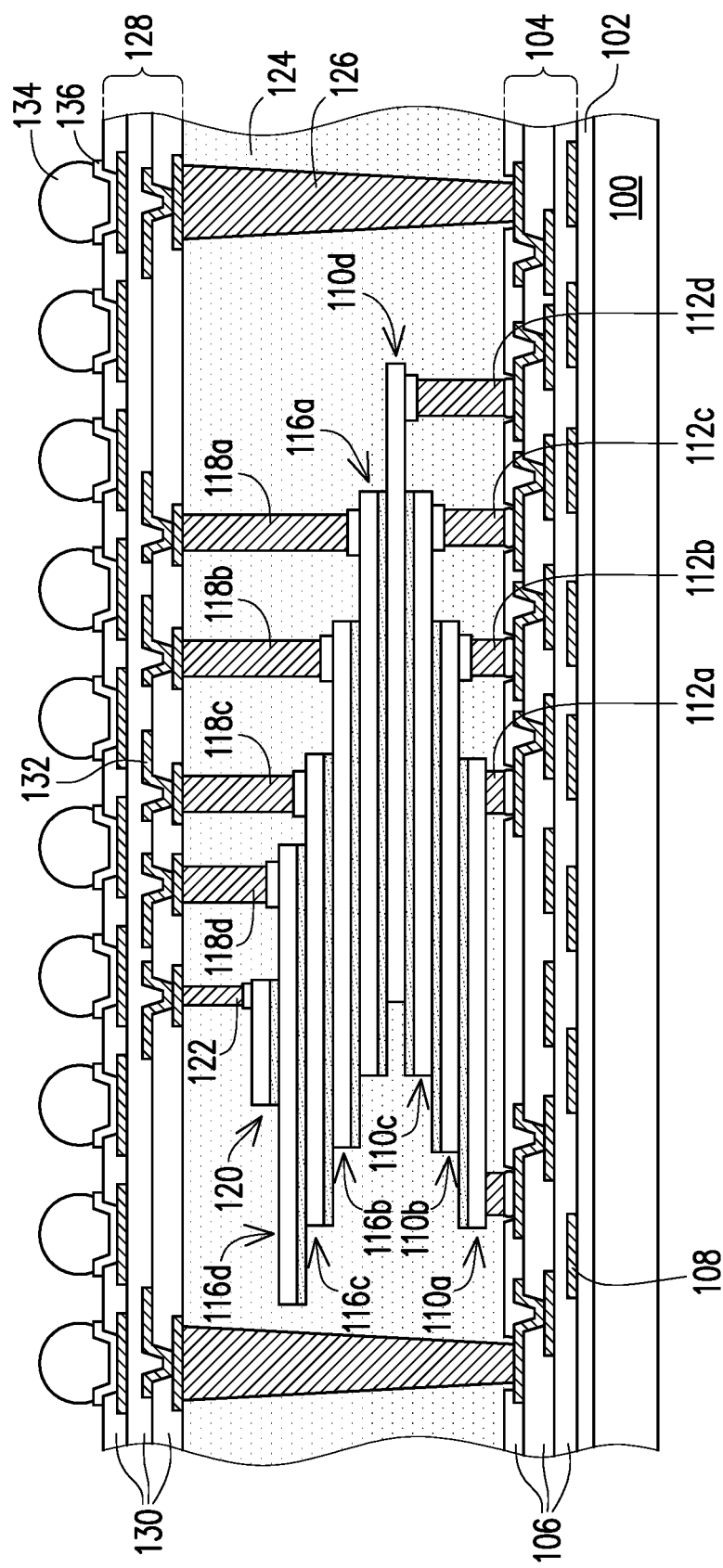

Referring to FIG. 1 and FIG. 2L, step S122 is performed, and the carrier 100 is detached from the first redistribution structure 104. In those embodiments where the insulating layer 102 formed on the carrier 100 includes a LTHC release layer or a thermal release layer, the carrier 100 can be detached from the first redistribution structure 104 as the LTHC release layer or the thermal release layer lose its adhesive property when exposed to light or heat. In the embodiments where the insulating layer 102 includes the release layer and a dielectric layer, the dielectric layer may be remained after detaching the carrier 100, whereas the release layer may be removed along with the carrier 100. In other words, in these embodiments, a portion of the insulating layer 102 is remained at a surface of the first redistribution structure 104 (e.g., a bottom surface of the first redistribution structure 104 as shown in FIG. 2L).

Figure 2M:
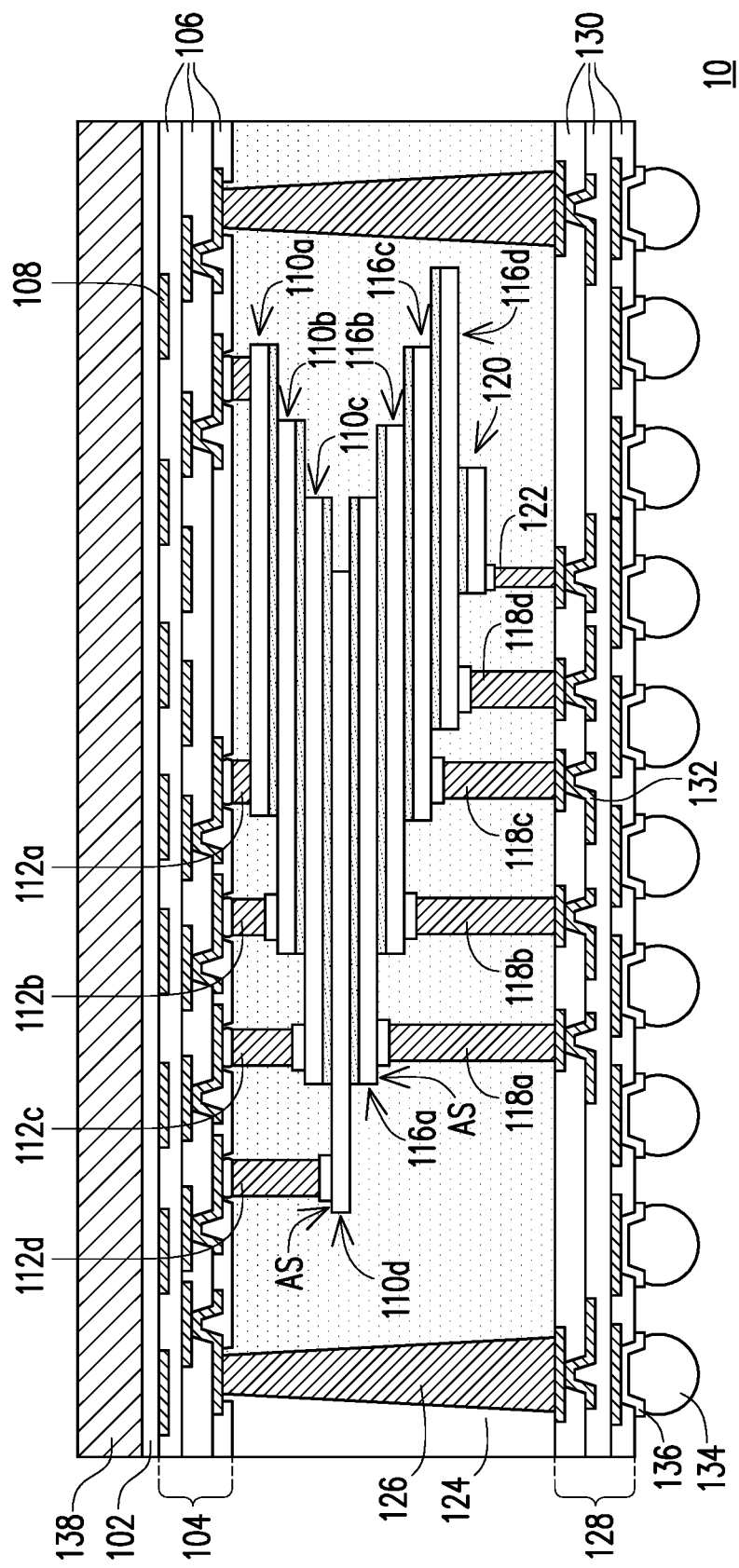

Referring to FIG. 1 and FIG. 2M, step S124 is performed, and the current package structure is flipper over, and subjected to a singulation process. Each one of the singulated package structure includes at least one stack of the semiconductor dies (including, for example, the first semiconductor dies 110a-110d, the second semiconductor dies 116a-116d and the third semiconductor die 120) encapsulated by the encapsulant 124, and includes the first and second redistribution structures 104 and 128 located at opposite sides of the encapsulant 124. In some embodiments, each of the singulated package structure further includes some of the through encapsulant vias 126 and some of the electrical connectors 134. One or more stacks of the semiconductor dies is located between adjacent through encapsulant vias 126. The electrical connectors 134 are disposed at a surface of the second redistribution structure 128 (e.g., a bottom surface of the second redistribution structure 128 as shown in FIG. 2M). The first semiconductor dies (e.g., the first semiconductor dies 110a-110d) in the stack of the semiconductor dies are attached to the first redistribution structure 104 through their conductive pillars (e.g., the conductive pillars 112a-112d), whereas the second semiconductor dies (e.g., the second semiconductor dies 116a-116d) as well as the third semiconductor dies 120 are in contact with the second redistribution structure 128 through their conductive pillars (e.g., the conductive pillars 118a-118d and 122). In other words, the conductive pillars of the first semiconductor dies (e.g., the conductive pillars 112a-112d of the first semiconductor dies 110a-110d) extend toward the first redistribution structure 104, whereas the conductive pillars of the second semiconductor dies and the third semiconductor dies (e.g., the conductive pillars 118a-118d and 122 of the second and third semiconductor dies 116a-116d and 120) extend toward the second redistribution structure 128.

Thereafter, step S126 is performed, and a thermal dissipation structure 138 is disposed over the first redistribution structure 104. In the embodiments where at least a portion of the insulating layer 102 is remained after detaching the carrier 100, the remaining portion of the insulating layer 102 is sandwiched between the first redistribution structure 104 and the thermal dissipation structure 138. In some embodiments, the thermal dissipation structure 138 is a thermally conductive lid, such as a metal lid. In alternative embodiments, the thermal dissipation structure 138 has a base portion and a plurality of fin structures vertically extending from the base portion (both not shown). Those skilled in the art may choose an appropriate type of the thermal dissipation structure according to design requirements, the present disclosure is not limited thereto. A material of the thermal dissipation structure may include Cu, Al or other metals. Furthermore, a thermal interfacial material (TIM) layer (not shown) may be disposed between the thermal dissipation structure 138 and the first redistribution structure 104 (or between the thermal dissipation structure 138 and the remained portion of the insulating layer 102). A material of the TIM layer may include a polymer material (e.g., thermal grease or thermal tape) containing conductive material such as metal or metal oxide particles.

Up to here, a semiconductor package 10 is formed. The semiconductor package 10 includes a stack of the semiconductor dies including the first semiconductor dies (e.g., the first semiconductor dies 110a-110d) and the second semiconductor dies (the second semiconductor dies 116a-116d) laterally encapsulated in the encapsulant 124, and includes the first redistribution structure 104 and the second redistribution structure 128 at opposite sides of the encapsulant 124. In this way, a stress induced by a coefficient of thermal expansion (CTE) difference between the first redistribution structure 104 and the encapsulant 124 may be at least partially cancelled by the stress induced by a CTE difference between the second redistribution structure 128 and the encapsulant 124. Therefore, the semiconductor package 10 is less susceptible to a warpage problem, and the electrical connectors 134 formed over the second redistribution structure 128 may be better attached to the second redistribution structure 128. In addition, the active sides AS of the first semiconductor dies (e.g., the first semiconductor dies 110a-110d) in the stack of the semiconductor dies face toward the first redistribution structure 104, and the conductive pillars (e.g., the conductive pillars 112a-112d) at the active sides AS of the first semiconductor dies (e.g., the first semiconductor dies 110a-110d) are attached and electrically connected to the first redistribution structure 104. On the other hand, the active sides AS of the second semiconductor dies (e.g., the second semiconductor dies 116a-116d) face toward the second redistribution structure 128, and the conductive pillars (e.g., the conductive pillars 118a-118d) at the active sides AS of the second semiconductor dies (e.g., the second semiconductor dies 116a-116d) extend and electrically connect to the second redistribution structure 128. As such, out-routing and communication of the first semiconductor dies (e.g., the first semiconductor dies 110a-110d) and the second semiconductor dies (e.g., the second semiconductor dies 116a-116d) can be realized through their conductive pillars (e.g., the conductive pillars 112a-112d and 118a-118d) and the first and second redistribution structures 104 and 128 without help of through silicon vias (TSV), and a manufacturing cost of the semiconductor package 10 can be reduced.

Figure 3:
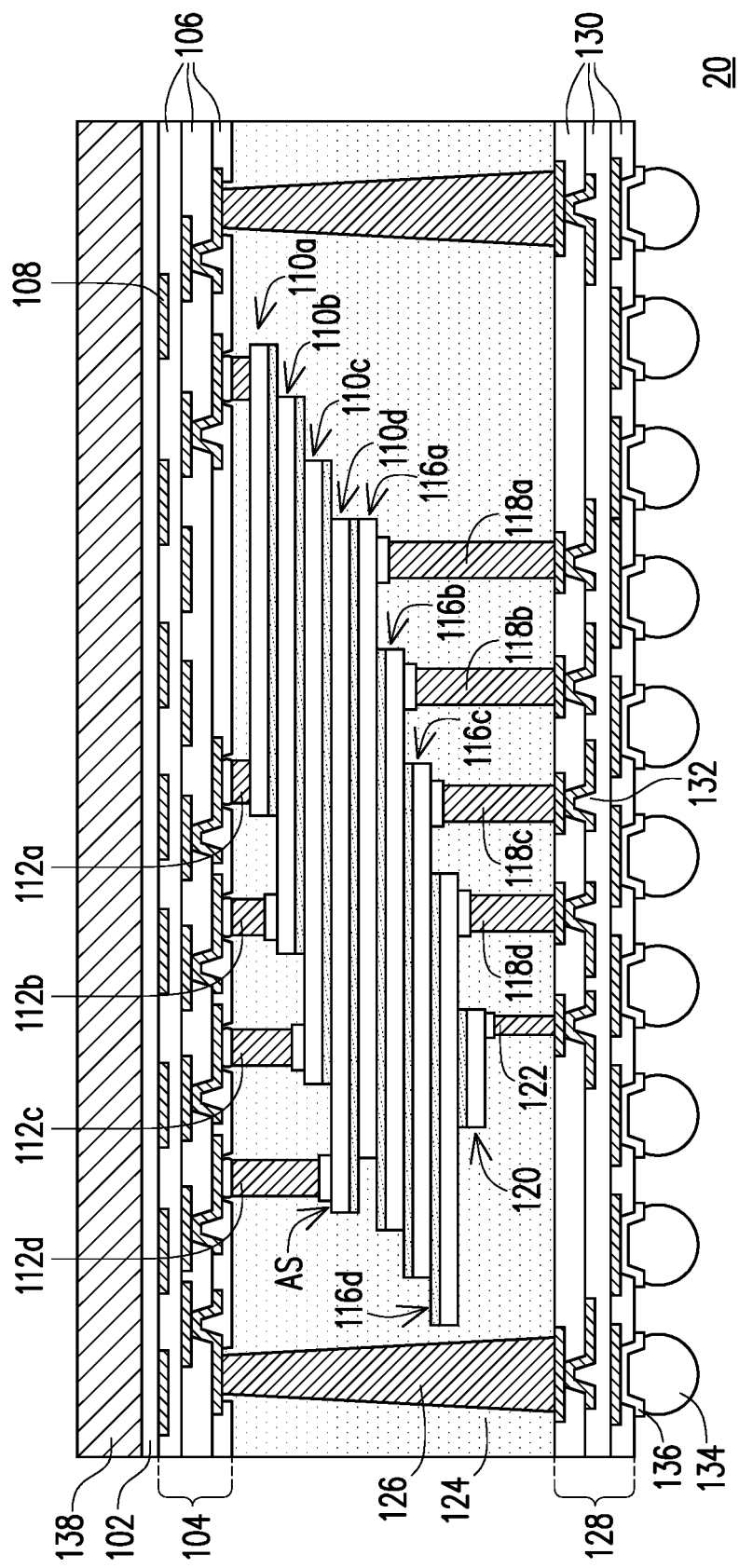
FIG. 3 is a schematic cross-sectional view illustrating a semiconductor package according to some embodiments of the present disclosure.

FIG. 3 is a schematic cross-sectional view illustrating a semiconductor package 20 according to some embodiments of the present disclosure. The semiconductor package 20 shown in FIG. 3 is similar to the semiconductor package 10 shown in FIG. 2M. Only differences therebetween will be described, the like or the same part may not be repeated again.

Referring to FIG. 3, the first semiconductor die (e.g., the first semiconductor die 110b) is offset from the underlying semiconductor die (e.g., the first semiconductor die 110a) along a direction that is identical with a direction along which the second semiconductor die (e.g., the second semiconductor die 116b) is offset from the underlying second semiconductor die (e.g., the second semiconductor die 116a). For instance, the first semiconductor die (e.g., the first semiconductor die 110b) and the second semiconductor die (e.g., the second semiconductor die 116b) are both offset to the right side of the underlying semiconductor die. Accordingly, the conductive pillars of the first semiconductor dies (e.g., the conductive pillars 112a-112d of the first semiconductor dies 110a-110d) extending toward the first redistribution structure 104 and the conductive pillars of the second semiconductor dies (e.g., the conductive pillars 118a-118d of the second semiconductor dies 116a-116d) extending toward the second redistribution structure 128 are located within different half parts of the stack of the semiconductor dies. For instance, the conductive pillars of the first semiconductor dies (e.g., the conductive pillars 112a-112d of the first semiconductor dies 110a-110d) are located within a right half part of the stack of the semiconductor dies, whereas the conductive pillars of the second semiconductor dies (e.g., the conductive pillars 118a-118d of the second semiconductor dies 116a-116d) are located within a left half part of the stack of the semiconductor dies.

As above, the semiconductor package according to some embodiments in the present disclosure includes a stack of the semiconductor dies including the first semiconductor dies and the second semiconductor dies laterally encapsulated in the encapsulant, and includes the first redistribution structure and the second redistribution structure at opposite sides of the encapsulant. In this way, a stress induced by a coefficient of thermal expansion (CTE) difference between the first redistribution structure and the encapsulant may be at least partially cancelled by the stress induced by a CTE difference between the second redistribution structure and the encapsulant. Therefore, the semiconductor package is less susceptible to a warpage problem, and the electrical connectors formed over the second redistribution structure may be better attached to the second redistribution structure. In addition, the active sides of the first semiconductor dies in the stack of the semiconductor dies face toward the first redistribution structure, and the conductive pillars at the active sides of the first semiconductor dies are attached and electrically connected to the first redistribution structure. On the other hand, the active sides of the second semiconductor dies face toward the second redistribution structure, and the conductive pillars at the active sides of the second semiconductor dies extend and electrically connect to the second redistribution structure. As such, out-routing and communication of the first semiconductor dies and the second semiconductor dies can be realized through their conductive pillars and the first and second redistribution structures without help of through silicon vias (TSV), and a manufacturing cost of the semiconductor package can be reduced.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A semiconductor package, comprising:
a first redistribution structure;
a second redistribution structure, vertically overlapped with the first redistribution structure;
a first semiconductor die and a second semiconductor die, located between the first and second redistribution structures, and respectively having an active side and a back side opposite to the active side, as well as a conductive pillar at the active side, wherein the back side of the first semiconductor die is attached to the back side of the second semiconductor die, the conductive pillar of the first semiconductor die is attached to the first redistribution structure, and the conductive pillar of the second semiconductor die extends to the second redistribution structure;
an additional first semiconductor die, having an active side and a back side opposite to the active side, and having a conductive pillar at the active side, wherein the back side of the additional first semiconductor die is attached to an open area of the active side of the first semiconductor die that is free of the conductive pillar, and the conductive pillar of the additional first semiconductor die is attached to the first redistribution structure; and
an additional second semiconductor die, having an active side and a back side opposite to the active side, and having a conductive pillar at the active side, wherein the back side of the additional second semiconductor die is attached to an open area of the active side of the second semiconductor die that is free of the conductive pillar, and the conductive pillar of the additional second semiconductor die extends to the second redistribution structure; and
an encapsulant, laterally encapsulating the first semiconductor die, the additional first semiconductor die, the second semiconductor die and the additional second semiconductor die.

2. The semiconductor package according to claim 1, wherein the conductive pillar of the first semiconductor die is located outside a span of the additional first semiconductor die, and the additional first semiconductor die is partially overlapped with the first semiconductor die,
wherein the conductive pillar of the second semiconductor die is located outside a span of the additional second semiconductor die, and the additional second semiconductor die is partially overlapped with the second semiconductor die.

3. The semiconductor package according to claim 1,
wherein the conductive pillar of the first semiconductor die is located within a peripheral region of the first semiconductor die,
wherein the conductive pillar of the second semiconductor die is located within a peripheral region of the second semiconductor die.

4. The semiconductor package according to claim 1, wherein
the additional first semiconductor die is offset from the first semiconductor die along a first direction that is opposite to a second direction along which the additional second semiconductor die is offset from the second semiconductor die.

5. The semiconductor package according to claim 1, wherein the additional first semiconductor die is offset from the first semiconductor die along a direction that is identical with a direction along which the additional second semiconductor die is offset from the second semiconductor die.

6. The semiconductor package according to claim 1, further comprising:
a first die attach film, disposed between the first semiconductor die and the additional first semiconductor die; and
a second die attach film, disposed between the second semiconductor die and the additional second semiconductor die.

7. The semiconductor package according to claim 1, further comprising:
a third semiconductor die, located between the additional second semiconductor die and the second redistribution structure, and respectively having an active side and a back side opposite to the active side, as well as a conductive pillar at the active side, wherein the back side of the third semiconductor die is attached to an open area of the active side of the additional second semiconductor die that is free of the conductive pillar, and the conductive pillar of the third semiconductor die extends to the second redistribution structure.

8. The semiconductor package according to claim 7, wherein the third semiconductor die is smaller than the additional second semiconductor die, and substantially the whole back side of the third semiconductor die is attached to the additional second semiconductor die.

9. The semiconductor package according to claim 1, further comprising:
a through encapsulant via, penetrating through the encapsulant and electrically connected to the first and second redistribution structures.

10. The semiconductor package according to claim 1, further comprising:
a plurality of electrical connectors, disposed at a surface of the second redistribution structure that is facing away from the encapsulant.

11. The semiconductor package according to claim 1, further comprising:
a thermal dissipation structure, disposed at a surface of the first redistribution structure that is facing away from the encapsulant.

12. A manufacturing method of a semiconductor package, comprising:

forming a first redistribution structure over a carrier;

attaching a first semiconductor die and an additional first semiconductor die onto the first redistribution structure, wherein the first semiconductor die and the additional first semiconductor die respectively have an active side facing toward the first redistribution structure and a back side opposite to the active side, and has a conductive pillar located at the active side of the first semiconductor die and attached to the first redistribution structure, wherein the additional first semiconductor die is attached to the first redistribution structure before attachment of the first semiconductor die, and wherein an open area of the active side of the first semiconductor die is attached with the back side of the additional first semiconductor die;

attaching a second semiconductor die and an additional second semiconductor die onto the first semiconductor die, wherein the second semiconductor die and the additional second semiconductor die respectively have an active side facing away from the first redistribution structure and a back side opposite to the active side, and has a conductive pillar at the active side of the second semiconductor die and extending away from the first redistribution structure, wherein the additional second semiconductor die is attached to the first semiconductor die after attachment of the second semiconductor die, and wherein an open area of the second semiconductor die is attached with the back side of the additional second semiconductor die;

laterally encapsulating the first and second semiconductor dies as well as the additional first and second semiconductor dies with an encapsulant;

forming a second redistribution structure on the encapsulant, wherein the second redistribution structure is electrically connected with the conductive pillars of the second semiconductor die and the additional second semiconductor die; and detaching the carrier.

13. The manufacturing method of the semiconductor package according to claim 12, further comprising: attaching a third semiconductor die onto the additional second semiconductor die after attaching the additional second semiconductor die onto the second semiconductor die, wherein the third semiconductor die has an active side facing away from the first redistribution structure and a back side opposite to the active side, as well as a conductive pillar located at the active side of the additional second semiconductor die and extending away from the first redistribution structure, the third semiconductor die is smaller than the additional second semiconductor die, and substantially the whole back side of the third semiconductor die is attached onto the additional second semiconductor die.

14. The manufacturing method of the semiconductor package according to claim 12, further comprising: forming a through encapsulant via in the encapsulant after laterally encapsulating the first and second semiconductor dies with the encapsulant, wherein the through encapsulant via penetrates through the encapsulant, and is electrically connected with the first redistribution structure.

15. The manufacturing method of the semiconductor package according to claim 12, further comprising: forming a through encapsulant via on the first redistribution structure before laterally encapsulating the first and second semiconductor dies with the encapsulant, wherein the through encapsulant via is also laterally encapsulated by the encapsulant during the step of laterally encapsulating the first and second semiconductor dies with the encapsulant.

16. The manufacturing method of the semiconductor package according to claim 12, further comprising: forming a plurality of electrical connectors at a surface of the second redistribution structure that is facing away from the encapsulant after the step of forming the second redistribution structure.

17. The manufacturing method of the semiconductor package according to claim 12, further comprising: disposing a thermal dissipation structure at a surface of the first redistribution structure that is facing away from the encapsulant after the step of forming the second redistribution structure.

* * * * *